United States Patent
Bishop et al.

(10) Patent No.: US 11,582,890 B2
(45) Date of Patent: Feb. 14, 2023

(54) EQUIPMENT ENCLOSURE

(71) Applicant: BAE Systems plc, London (GB)

(72) Inventors: Simon Bishop, Christchurch (GB); Carl Martin Matthews, Christchurch (GB); Curtis Baker, Christchurch (GB)

(73) Assignee: BAE Systems plc, London (GB)

( * ) Notice: Subject to any disclaimer, the term of this patent is extended or adjusted under 35 U.S.C. 154(b) by 0 days.

(21) Appl. No.: 17/638,479

(22) PCT Filed: Sep. 10, 2020

(86) PCT No.: PCT/GB2020/052169
§ 371 (c)(1),
(2) Date: Feb. 25, 2022

(87) PCT Pub. No.: WO2021/053319
PCT Pub. Date: Mar. 25, 2021

(65) Prior Publication Data
US 2022/0312652 A1    Sep. 29, 2022

(30) Foreign Application Priority Data

Sep. 18, 2019   (GB) ..................................... 1913445
Oct. 29, 2019   (EP) ..................................... 19275109

(51) Int. Cl.
*H05K 9/00*    (2006.01)
*H05K 7/02*    (2006.01)

(52) U.S. Cl.
CPC ........... *H05K 9/0009* (2013.01); *H05K 7/026* (2013.01); *H05K 9/0018* (2013.01); *H05K 9/0086* (2013.01)

(58) Field of Classification Search
CPC .. H05K 9/0009; H05K 9/0018; H05K 9/0086; H05K 9/0062; H05K 7/026
(Continued)

(56) References Cited

U.S. PATENT DOCUMENTS 3,340,439 A * 9/1967 Marvin .................... H05K 7/06
                                                    439/177
5,285,007 A     2/1994 Deluca et al.
(Continued)

FOREIGN PATENT DOCUMENTS

CN    203574269 U    4/2014
CN    106451167 A    2/2017
(Continued)

OTHER PUBLICATIONS

International Preliminary Report on Patentability for PCT/GB2020/052169 dated Mar. 31, 2022, 10 pages.
(Continued)

*Primary Examiner* — Anatoly Vortman
*Assistant Examiner* — Zhengfu J Feng
(74) *Attorney, Agent, or Firm* — Maine Cernota & Rardin

(57) ABSTRACT

An equipment enclosure (1) for electromagnetically isolating an electronic device, the equipment enclosure 1 comprising a conductive housing (3) and a plurality of conductive sheets (5). Each sheet (5) includes an aperture (7). The sheets (5) are stacked in a spaced-apart relationship within the housing (3) thereby defining a plurality of electromagnetically-isolated cavities (9) each within a respective Faraday cage formed by the conductive housing (3) and the conductive sheets (5). The apertures (7) form a channel (11) that extends through the enclosure (1) providing a route for connections between the cavities (9).

16 Claims, 9 Drawing Sheets

(58) Field of Classification Search
USPC .......................................................... 361/818
See application file for complete search history.

(56) References Cited

U.S. PATENT DOCUMENTS

| | | | | |
|---|---|---|---|---|
| 5,335,144 | A * | 8/1994 | Maroushek | ........ H05K 7/20136 |
| | | | | 165/122 |
| 5,504,659 | A | 4/1996 | Acatay et al. | |
| 9,793,692 | B1 * | 10/2017 | Pogash | .................. H02G 3/083 |
| 2011/0063810 | A1 * | 3/2011 | Chen | ....................... H05K 9/006 |
| | | | | 361/752 |
| 2012/0262876 | A1 * | 10/2012 | Hensley | ............... H05K 7/1487 |
| | | | | 312/107 |
| 2015/0289389 | A1 * | 10/2015 | Conway | ............... H05K 5/0021 |
| | | | | 220/4.01 |
| 2015/0300878 | A1 | 10/2015 | Cobler et al. | |
| 2016/0205814 | A1 * | 7/2016 | Burke | .................... H05K 9/006 |
| | | | | 174/377 |
| 2016/0212884 | A1 * | 7/2016 | Ruberto | ..................... G06F 1/20 |
| 2016/0324019 | A1 * | 11/2016 | Burke | ...................... H01Q 1/28 |
| 2019/0326703 | A1 | 10/2019 | Chen | |
| 2021/0018546 | A1 * | 1/2021 | Embleton | ............... G06F 1/182 |
| 2021/0059081 | A1 * | 2/2021 | Embleton | ............ H05K 9/0062 |

FOREIGN PATENT DOCUMENTS

| | | |
|---|---|---|
| CN | 206698536 U | 12/2017 |
| CN | 207531211 U | 6/2018 |
| CN | 208191057 U | 12/2018 |
| CN | 208691643 U | 4/2019 |
| JP | 2006100419 A | 4/2006 |
| WO | 9216094 A1 | 9/1992 |

OTHER PUBLICATIONS

PCT International Search Report and Written Opinion of PCT Application No. PCT/GB2020/052169, dated Dec. 1, 2020, 12 pages.
European Search Report Application No. 19275109.7, dated Mar. 27, 2020, 10 pages.
Great Britain Search Report Application No. GB 1913445.1, dated Mar. 12, 2020, 4 pages.

* cited by examiner

EQUIPMENT ENCLOSURE

RELATED APPLICATIONS

This application is a national phase application filed under 35 USC § 371 of PCT Application No. PCT/GB2020/052169 with an International filing date of Sep. 10, 2020, which claims priority of GB Patent Application 1913445.1 filed on Sep. 18, 2019 and EP Patent Application 19275109.7 filed on Oct. 29, 2019. Each of these applications is herein incorporated by reference in its entirety for all purposes.

FIELD

The present invention concerns an equipment enclosure for electromagnetically isolating an electronic device, and in particular apparatus for housing an electronic device comprising a plurality of components.

BACKGROUND

A typical electronic device such as a computing device will include a plurality of components, such as a router, a power source, a graphics card, a heat exchanger and a processor. In some situations, for security purposes, it is necessary to shield computing devices or the components of the computing device, so that the devices are electromagnetically-isolated from the surrounding environment. These protection efforts can be encompassed under the term emissions security (EMSEC), which is a subset of communications security (COMSEC).

TEMPEST is a known shielding codename, which encompasses a collection of shielding techniques. TEMPEST shielding is concerned with the prevention of leaked electromagnetic signals and/or sound/mechanical vibrations.

To achieve TEMPEST shielding for an electronic device, the device needs to be electromagnetically-isolated. This is usually achieved by placing the device in a Faraday cage that blocks electromagnetic fields that are radiating from the device. If the electronic device comprises a plurality of components, each component may require TEMPEST shielding, and may be individually isolated from electromagnetic radiation. The shielding used for the device or for each component of the device may result in the communications enclosure being large and heavy.

Furthermore, each item shielded by a Faraday cage may be placed in a hermetically sealed box. Sealed boxes housing components of the communications device may be difficult to cool. Known mechanisms for cooling the components often require the use of air conditioning which adds further weight to the enclosure.

The present invention seeks to mitigate the above-mentioned problems.

SUMMARY

The present invention provides, according to a first aspect, an equipment enclosure.

It will of course be appreciated that features described in relation to one aspect of the present invention may be incorporated into other aspects of the present invention.

DESCRIPTION OF THE DRAWINGS

Embodiments of the present invention will now be described by way of example only with reference to the accompanying schematic drawings of which.

DETAILED DESCRIPTION

Figure 1:
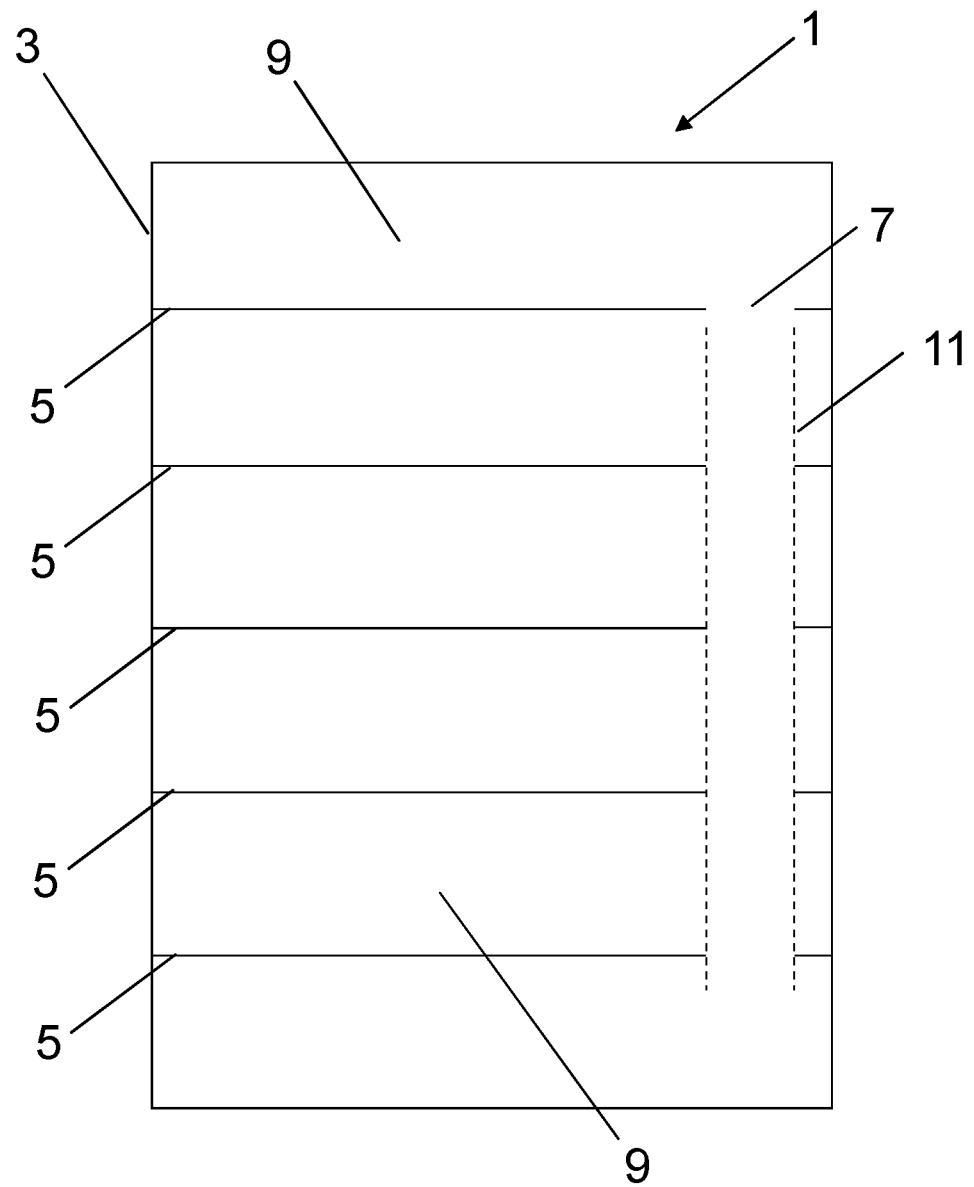
FIG. 1 is a schematic cross-sectional view of an equipment enclosure for electromagnetically-isolating a computing device according to an example embodiment of the invention.

According to a first aspect, the present invention provides an equipment enclosure for electromagnetically isolating an electronic device. The equipment enclosure comprises a conductive housing and a plurality of conductive sheets. Each sheet includes an aperture. The sheets are stacked in a spaced-apart relationship within the housing, thereby defining a plurality of electromagnetically-isolated cavities each within a respective Faraday cage formed by the conductive housing and the conductive sheets. The apertures form a channel that extends through the enclosure providing a route for connections between the cavities.

Each conductive sheet may include two or more apertures. The apertures form two or more channels that extend through the enclosure, providing alternative routes for connections between the cavities.

A structure for attenuating electromagnetic radiation originating from the electronic device may be provided in each of the channels. The structure may be a 3-dimensional cellular structure, and may comprise a plurality of cells. The cells may form sub-channels extending through the channel. The cellular structure may be a 3-dimensional honeycomb structure. The structure may be an aluminium honeycomb structure.

The diameter of the channel may be at least 4× the diameter of each of the cells. The diameter of the channel may be at least 6× the diameter of each of the cells. The diameter of the cells that is required to attenuate electromagnetic radiation depends upon the wavelength of the radiation, in accordance with well-known physical principals as discussed below. The effect of a cellular structure on electromagnetic radiation depends on the size of the cells and the wavelength of the radiation. If the diameter of the cells is very much larger than the wavelength of the electromagnetic radiation originating from the device, the radiation may not interact with the structure and therefore may not be attenuated. If the diameter of the cells is very much smaller than the wavelength of the electromagnetic radiation originating from the device, the radiation may not 'see' the cells and therefore may not be attenuated. If the diameter of the cells is comparable to the wavelength of the electromagnetic radiation originating from the device, the radiation will be scattered by the cells, and the radiation tends to be attenuated by the structure.

Thus, the efficiency of the structure at attenuating radiation may be dependent upon the ratio of the cell diameter to the wavelength of the radiation originating from the device. The diameter of the cells may be selected to be comparable to the wavelength of electromagnetic radiation originating from the device. For example, the diameter of the cells may be the same order of magnitude as the wavelength of the radiation. The electronic device may generate electromagnetic radiation with a range of wavelengths. The range of wavelengths may be a distribution centered around a peak wavelength. The diameter of the cells may be selected such that cells attenuate radiation of the peak wavelength. The diameter of the cells may be smaller than the shortest wavelength of radiation emitted by the device.

The structure may extend the entire length of the channel. Alternatively, the structure may be a sheet structure. The structure may extend partway along the length of the channel.

If the structure is relatively inefficient at attenuating the radiation from the device (for example, if the cells are significantly larger or smaller than the wavelength of the radiation, or if the radiation spans a wide range of wavelengths), a long structure may be required to ensure sufficient attenuation. If the structure is relatively efficient at attenuating radiation from the device (for example, if the cells are comparable in diameter to the wavelength of the radiation from the device), a shorter structure, for example, a sheet structure, may provide sufficient attenuation.

The length of the sub-channels and therefore the length of the structure that is required to attenuate radiation generated by the device may also be dependent on the amplitude of the radiation. Longer sub-channels may be required to attenuate higher amplitude radiation. The length of the structure may therefore depend upon the amplitude of the radiation generated by the device.

The cell diameter and length of the structure may be chosen such that electromagnetic radiation from the components is attenuated by the structure and is not transmitted between cavities.

The sub-channels may allow air to pass through the channel. The sub-channels formed by the cells may be straight, curved or may comprise angled segments, such that zig-zag sub-channels are formed.

The structure may be selected based on the device, the number of components of the device, and the wavelength and amplitude of radiation originating from the device.

The conductive housing may comprise a cage or a box. The housing may comprise continuous sheets of conductive metal. The sheets should be sufficiently thick to absorb electromagnetic radiation originating from the device. The housing may comprise a wire mesh, providing that the apertures of the mesh are of a size that will block electromagnetic radiation from the device from passing through the housing and providing that the mesh is sufficiently thick to block radiation from passing through the housing, as explained above. The mesh may comprise conductive metal wire. The thickness of the sheet or the thickness of the mesh and size of the apertures may be selected depending on the device, the number of components of the device and the wavelength of radiation originating from the device.

The equipment enclosure may house an electronic device comprising a plurality of components. Each component may be housed in a different electro-magnetically isolated cavity in the enclosure.

The number of conducting sheets and therefore the number of electromagnetically-isolated cavities may be dependent on the number of components of the electronic device, or on the number of components that are required to be electromagnetically-isolated from each other. For a given electronic device, a communications enclosure with a suitable number of electromagnetically-isolated cavities may be selected. Each component may be housed in a separate cavity. More than one component may be housed in each cavity if these components do not need to be electromagnetically-isolated from each other.

Each electromagnetically isolated cavity may comprise at least one additional sheet e.g. a non-conductive sheet that subdivides the cavity into two or more sub-cavities. The additional sheet may be stacked in a spaced-apart relationship between two conductive sheets, thereby dividing each cavity into at two sub-cavities. Components of the device that do not need to be electromagnetically isolated from one another may be housed in different sub-cavities within the same cavity.

The volume and dimensions of the enclosure will be dependent upon the size, complexity and number of components of the electronic device. For a given communications device a suitably sized communications enclosure may be chosen. The size of enclosure may be chosen to avoid or minimise wasted space and excess weight. For example, a typical enclosure may be between 0.012 and 0.015 m2 in volume, or between 0.014 and 0.015 m2 in volume. An enclosure may have dimensions of approximately 0.275× 0.265×0.170 m.

The enclosure may include mounting means for mounting the enclosure on a wall or other surface.

The equipment enclosure may further comprise at least one external connector for providing a power supply to the electronic device. The external connector may connect at least one of the components of the electronic device to an external power supply. The external connector may be provided in an aperture in the enclosure housing.

The equipment enclosure may further comprise at least one internal connector for providing an internal connection between electromagnetically-isolated components of the electronic device that are housed within the enclosure. The internal connector may pass through a channel in the enclosure and may connect at least two electro-magnetically-isolated components. Any of the internal or external connectors may comprise a cable for coupling the components of the device or for coupling a component to an external power supply. The components of the electronic device may include connection ports for enabling connection to the internal and/or external connectors. The components may comprise internal connection ports for use with internal connectors and/or external connection ports for use with external connectors.

Each cable may comprise a ribbon cable, a fibre optic cable or traditional cable such as a standard network cable. The connection terminal couples the cable to the component. The connection terminals may be USB ports or modified RJ45 terminals, such as spring loaded RJ45 terminals, which couple components via a cable.

The internal connectors may comprise interslice bus connectors. Each interslice bus connector may comprise an interslice bus plug and an interslice socket for connecting components.

Internal connectors may pass through a channel in the enclosure and may connect at least two electro-magnetically isolated components. External connectors may connect at least one component to an external power source, or to another external component via a connector that passes through an aperture in the enclosure housing.

Components may be connected such that power can be transferred between the components. A component of the electronic device may receive power from an external power supply via an external connection, and this component may transfer power to other components of the device via an internal connection. Internal connectors may enable data to be transferred between components. Internal connectors may comprise power filters for transferring power between components.

Components housed in different cavities may be isolated from each other unless connected by an internal connection.

The equipment enclosure may include at least a first internal connector and a second internal connector. The different types of connector may provide different levels of shielding from external/internal interference or from electromagnetic signals. The first internal connector may connect components that require a first level of shielding. The second internal connector may connect components that require a second, different level of shielding. A first connector type may provide complete shielding from external and/or internal interference. A second connector type may protect from external interference.

The first internal connector may connect components via a cable that passes through a first channel in the enclosure. The second connector may connect components via a cable that passes through a second channel in the enclosure, or through the same first channel.

Diagnostics may be checked by a user by interfacing with the internal or external connectors.

Components requiring the same level of shielding may be connected by an internal connector, and these components may be isolated from other components requiring different levels of shielding. If a first component and a second component are housed in adjacent cavities and these components require different shielding levels, the second component may be bypassed from connection, and may either be a standalone component (i.e. not connected to any other components), or may be connected to another component in a different cavity that requires the same or a similar level of shielding.

The electronic device may comprise a computing device. The computing device may include at least one of a crypto unit, a processor, a router, a power supply unit, a high performance EMI filter, and a circulator.

The equipment enclosure may include a cooling mechanism for transferring heat away from the components of the device. The cooling mechanism may be any suitable cooling mechanism. The cooling mechanism may be a device that cools by convection, such as a fan.

Each conductive sheet in the equipment enclosure may include a further aperture, and these apertures may form a cooling channel extending through the housing. A cooling device may be provided in the cooling channel.

The cooling device may comprise a pressure vessel, wherein the pressure vessel comprises an evaporator proximate to a component. The cooling device may comprise a condenser end, and a working fluid provided within the pressure vessel. The working fluid may absorb heat at the evaporator, thereby generating a pressure gradient within the pressure vessel. The pressure gradient may cause the working fluid to flow away from the evaporator end towards the condenser end, thereby transferring heat away from the component.

The cooling device may comprise a pressure vessel, a porous wick structure and a working fluid. The wick structure may be arranged on the inside of the vessel proximate to a heat-generating component of the device. The wick structure may be arranged at an end of the cooling device, and this end of the device may function as an evaporator. As heat from the heat-generating component is input at the evaporator end, the working fluid vaporises, creating a pressure gradient. This pressure gradient pushes the vapour to flow along the device, through a central channel, to a condenser end. The condenser end may be proximate to a heat exchanger. At the condenser end, the vapour condenses due to this end being cooler, giving up its latent heat of vaporisation. The working fluid is then returned to the evaporator end by capillary forces developed in the wick structure or by gravity.

The pressure vessel of the heat pipe may comprise a material having a high strength and high thermal conductivity such as copper or aluminium. The working fluid may comprise a fluid having high latent heat of vaporisation and high thermal conductivity. The working fluid may comprise a fluid having a latent heat of vaporisation greater than 800 kJ/kg or greater than 1000 kJ/kg. The working fluid may comprise a fluid having a thermal conductivity greater than 0.15 W/m·K or greater than 0.5 W/m·K at room temperature. The working fluid may comprise liquid helium, ammonia, or alcohol such as ethanol. The wick structure maintains efficient capillary action when bent or used against gravity. The wick structure may comprise, for example, sintered copper powder, a screen or a series of grooves parallel to the longitudinal axis of the cooling device.

The evaporator end of the heat pipe may be proximate to a heat-generating component of the device. The opposite end (i.e. the condenser end) of the cooling device may be in proximity to at least one heat exchanger. In embodiments, the condenser end of the heat pipe is bifurcated such that one branch of the condenser end is disposed adjacent a first heat exchanger and another branch of the condenser end is disposed adjacent a second heat exchanger. In embodiments, when the heat pipe is not bifurcated, a heat exchanger may be disposed on either side of the condenser end of the cooling device.

The evaporator end of the cooling device may be bifurcated, or further divided to approach the heat-generating components of the device from different directions, or to allow a single cooling device to be used to transport heat away from a plurality of heat-generating components.

According to an example embodiment of the invention (FIGS. 1 and 2) an equipment enclosure 1 is provided for electromagnetically-isolating an electronic device.

The enclosure comprises a conductive housing 3 and a plurality of conductive sheets 5. Each conductive sheet 5 includes an aperture 7. The sheets 5 are stacked in a spaced-apart relationship within the housing 3, thereby defining a plurality of electromagnetically-isolated cavities 9. Each cavity 9 is electromagnetically-isolated from adjacent cavities 9 and each cavity 9 is within a Faraday cage formed by the conductive housing 3 and the conductive sheets 5.

Figure 2:
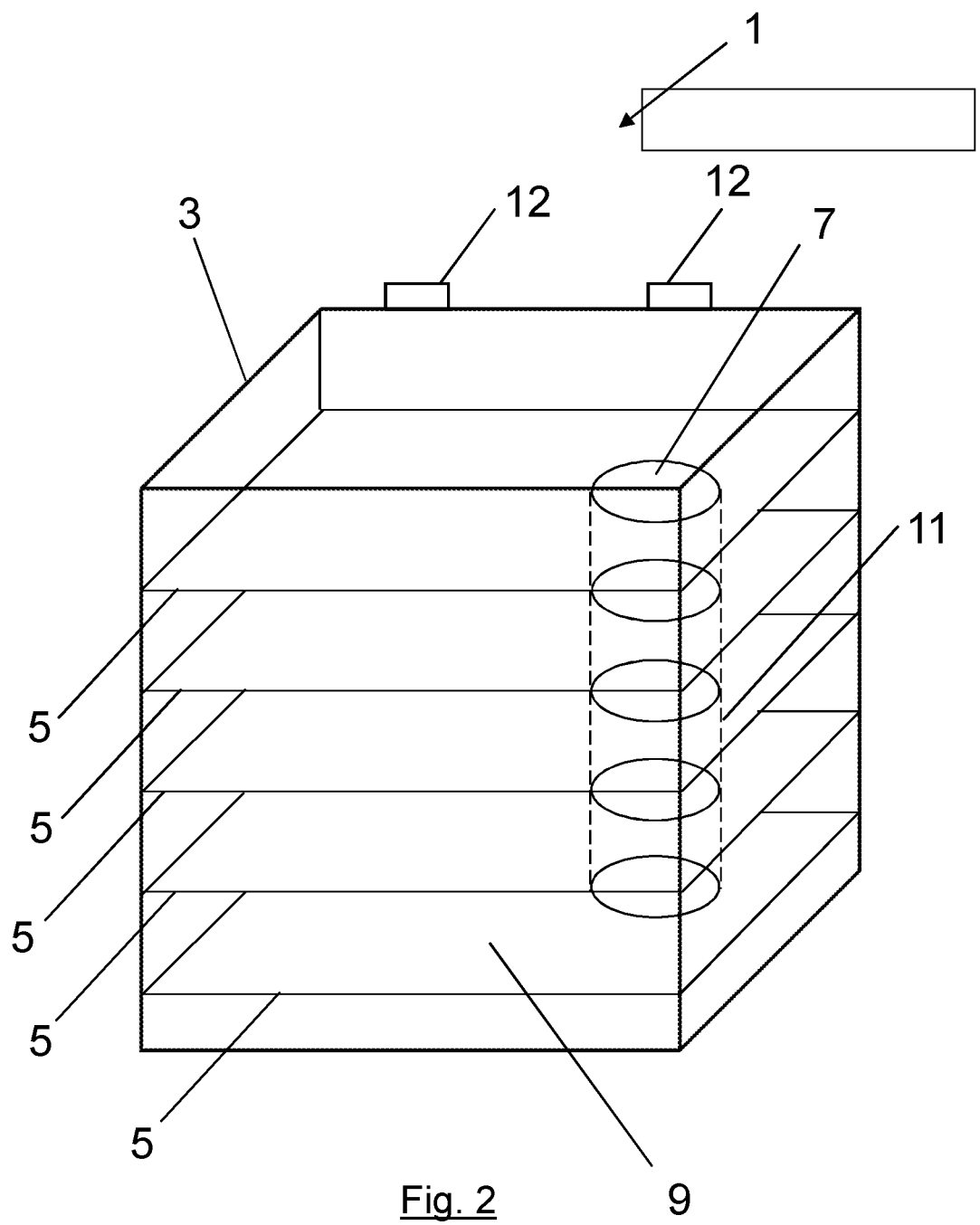
FIG. 2 is a schematic see-through perspective view the equipment enclosure of FIG. 1.

The apertures 7 form a channel 11 that extends through the housing 3 (indicated by dashed lines in FIGS. 1 and 2).

The enclosure 1 includes mounting means 12 (shown in FIG. 2) for mounting the enclosure 1 on a wall or other surface.

Figure 3:
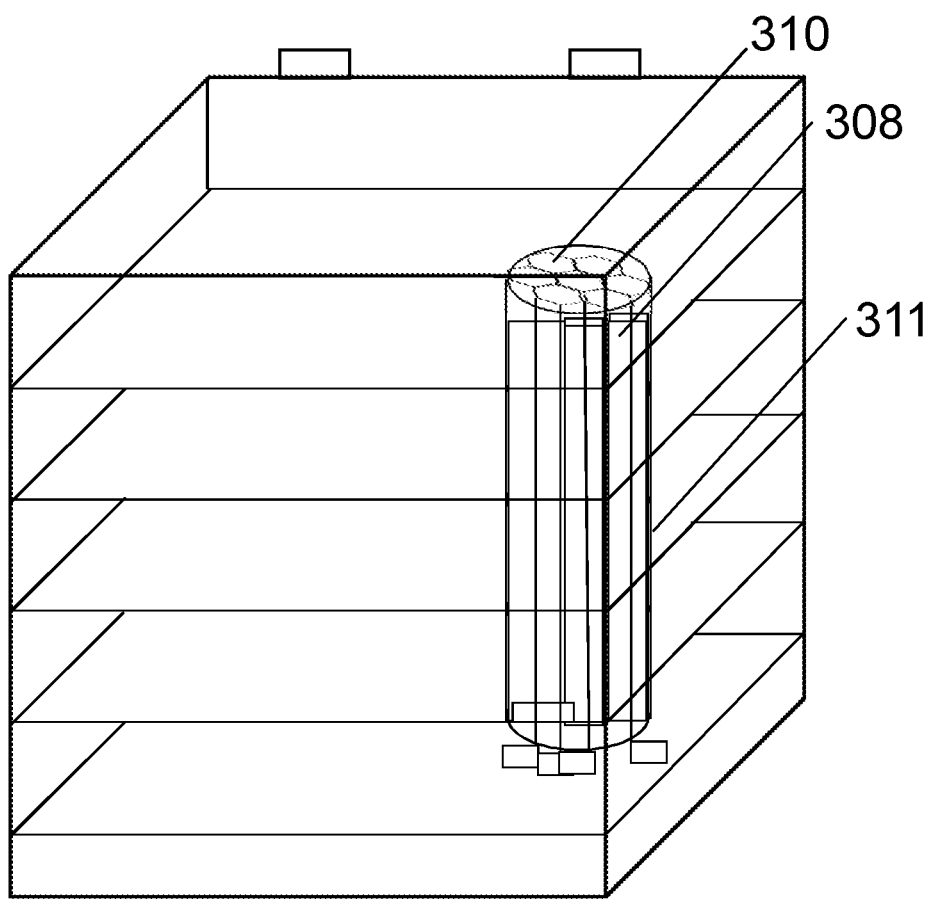
FIG. 3 is a schematic see-through perspective view of an equipment enclosure according to an example embodiment of the invention.

According to an example embodiment of the invention (FIG. 3) a 3-dimensional cellular honeycomb structure 308 is provided in a channel 311. The plurality of hexagonal cells 310 form sub-channels that extend through the channel 311.

Figure 4:
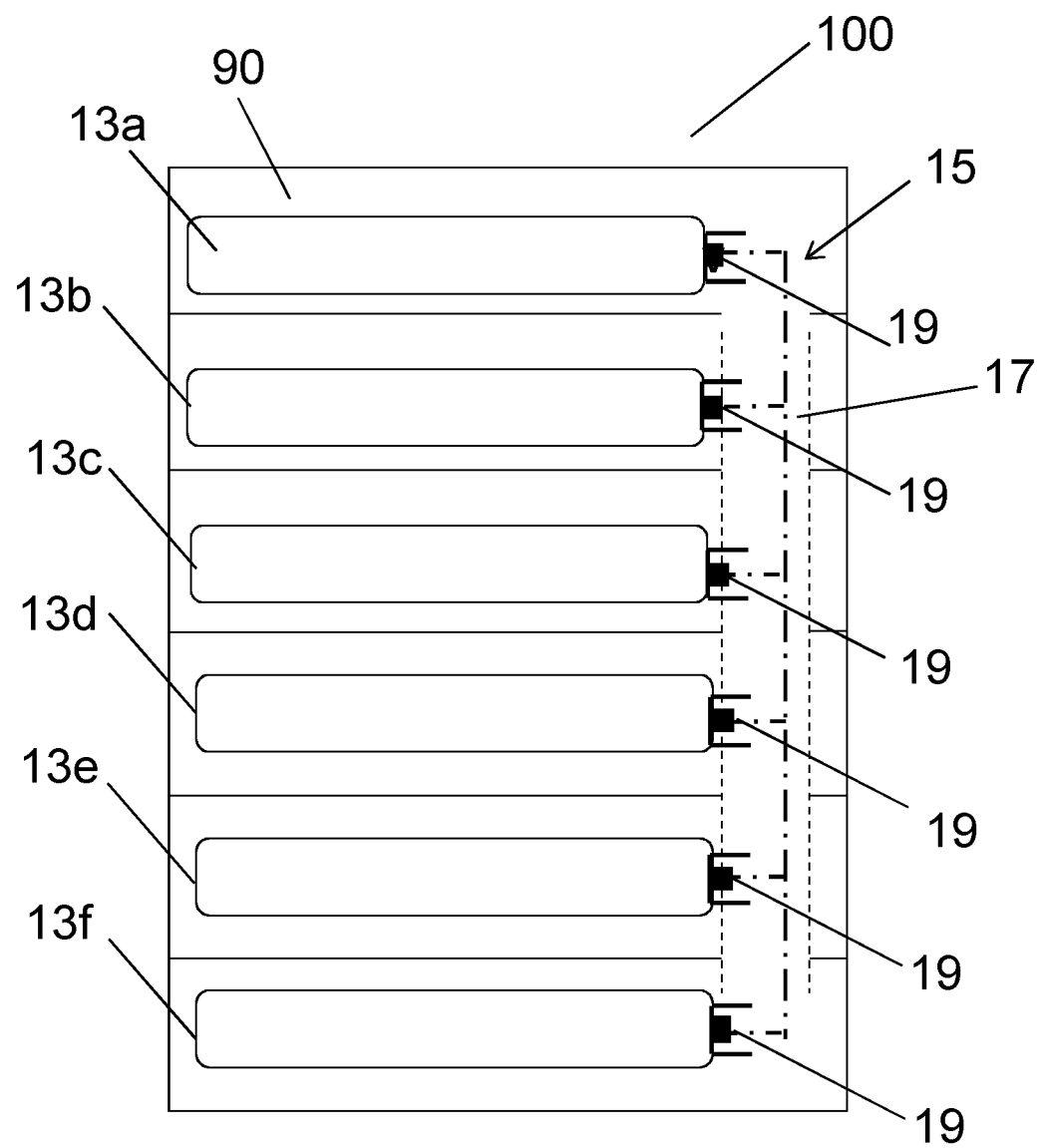
FIG. 4 is a schematic view of an equipment enclosure housing a computing device comprising multiple components according to an example embodiment of the invention, further comprising a connector for providing internal connection between the components.

According to an example embodiment of the invention (FIG. 4) the equipment enclosure 100 houses a computing device comprising a plurality of components 13*a-f*. The components 13*a-f* are housed in the cavities 90 provided in the enclosure 100. Each component is housed in a different cavity. Each component 13*a-f* is electromagnetically-isolated from components in other cavities 90. The components include a crypto unit 13*a*, a power supply unit 13*b*, a high performance EMI filter 13*c*, a circulator 13*d*, a processor 13*e*, and a router 13*f*. The components 13*a-f* are connected by an internal connector 15 that passes through a channel. The connector comprises a cable 17 and a plurality of connection terminals 19.

Figure 5:
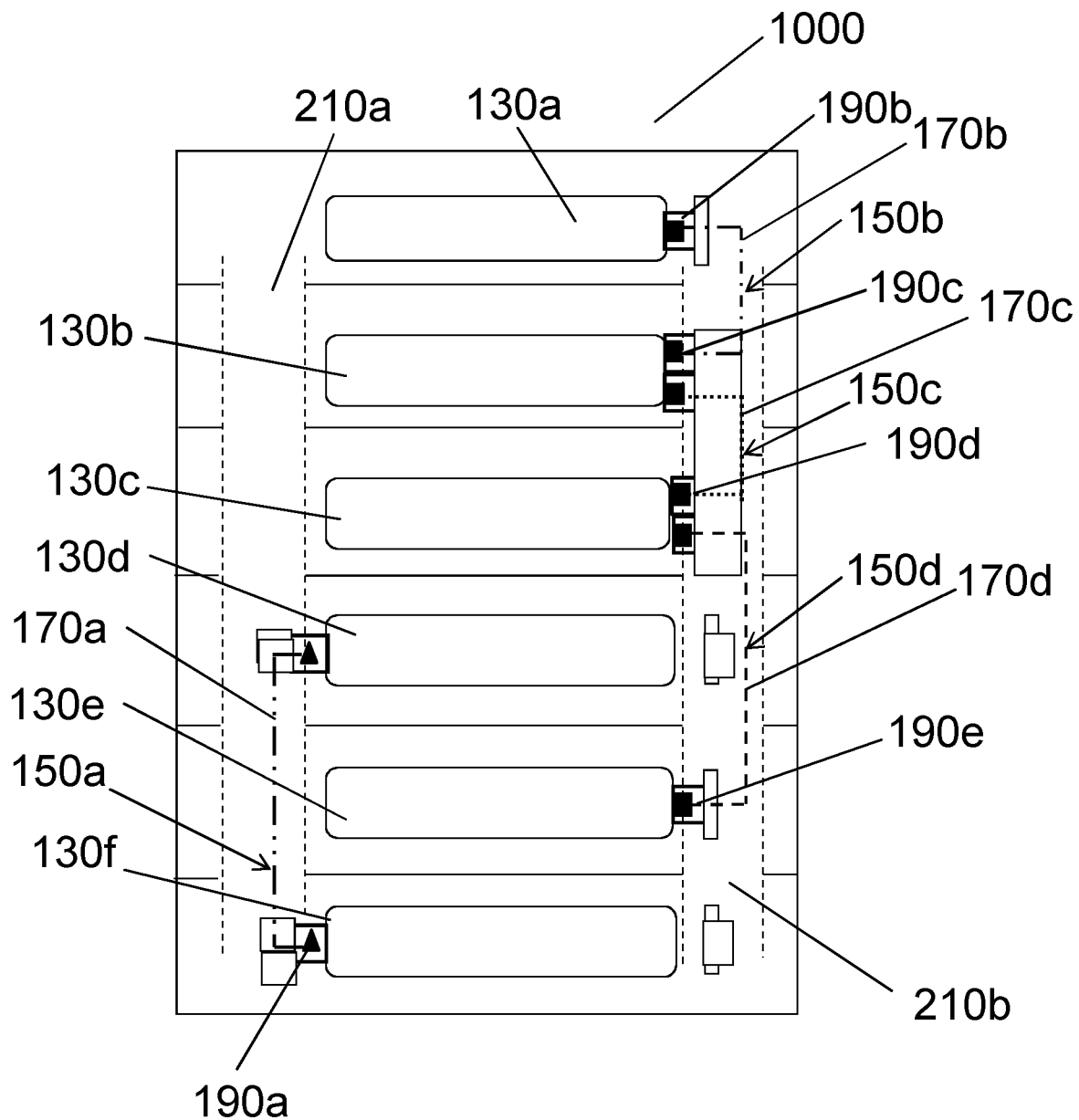
FIG. 5 is a schematic view of an equipment enclosure housing a computing device comprising multiple components, and further comprising connectors for providing internal connections between the components, according to an example embodiment of the invention.

According to an example embodiment of the invention (FIG. 5), the enclosure 1000 comprises more than one internal connector 150*a, b, c* and *d* for providing connections between components 130*a-f* of the equipment device. Connector 150*a* comprises a cable 170*a* and a connection terminal 190*a*/191*a* at each end of the cable 170*a*. The connection terminals 190*a*/191*a* couple to the components 130*d* and 130*f*.

Connectors 150*b, c* and *d* comprise cables 170*b, c,* and *d*, connection terminals 190*b*/191*b*, 190*c*/191*c*, 190*d*/191*d* and 190*e*/191*e* at each end of the cables 170*b, c* and *d*. The connection terminals 190*b, c* and *d* couple to the components 130*b, c* and *d*. The connectors 150*a* and 150*b/c/d* pass through different channels 210*a* and 210*b* to connect the components.

The connectors 150*a, b, c* and *d* are different types of connector and provide different levels of shielding. The connectors 150*a, b, c* and *d* may include different cable types 170*a, b, c* and *d*. For example, connector 150*a* is a high shielding connector, which couples two of the processors 130*d* and 130*f* from both external and internal interference. Connector 150*a* bypasses the component 130*e*, as this component requires a different level of shielding. Connector 150*b* is a lower shielding connector and connects the component 130*a* to the component 130*b*.

Figure 6:
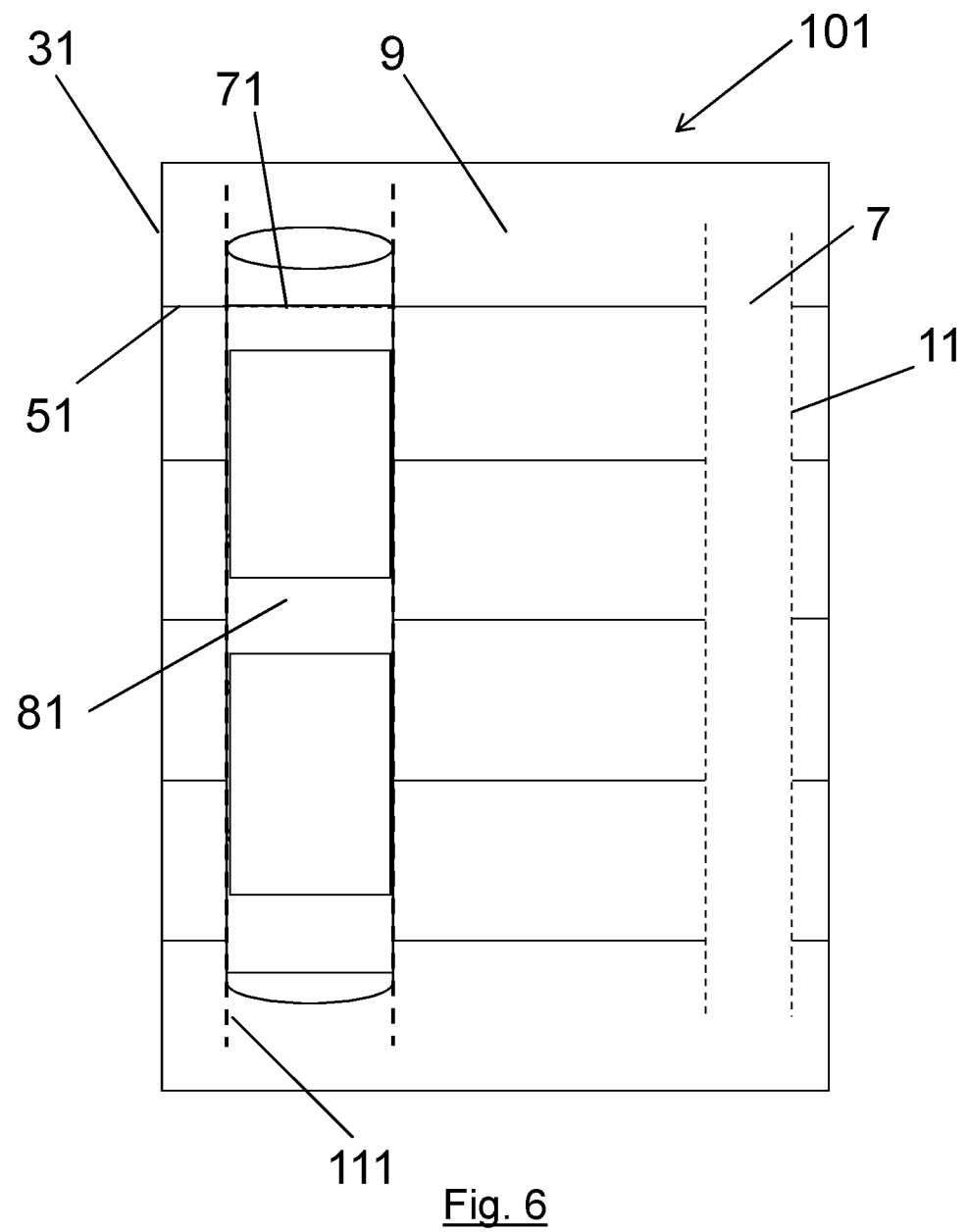
FIG. 6 is a schematic view of an equipment enclosure including a cooling mechanism according to an example embodiment of the invention.

According to an example embodiment of the invention (FIG. 6) the equipment enclosure 101 includes a cooling mechanism. Each conductive sheet 51 includes a second aperture 71, and these second apertures 71 form a second channel 111 extending through the housing 31. A cooling device 81 is disposed in the second channel 111 and provides cooling for the enclosure 101.

Figure 7:
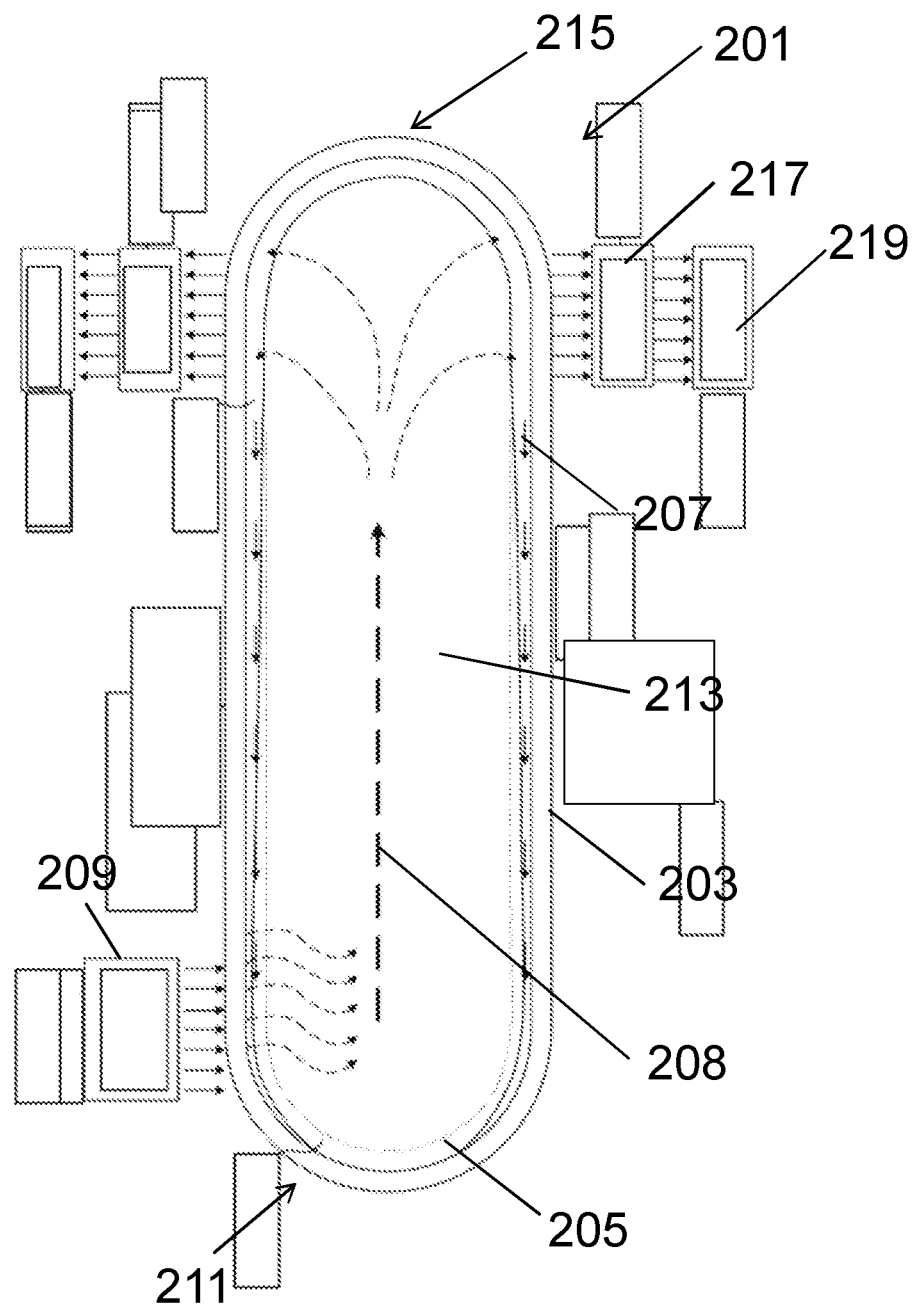
FIG. 7 is a schematic view of an example cooling device for use in an embodiment of the present invention.

FIG. 7 is a schematic view of an example cooling device 201 for use in the present invention. The cooling device comprises a pressure vessel 203, a porous wick structure 205 and a working fluid 207. The wick structure 205 is arranged on the inside of the vessel 203 proximate to a heat-generating component of the device 209. The wick structure 205 is arranged at an end 211 of the heat pipe 201 and this end 211 of the heat pipe 201 functions as an evaporator. Heat from the heat-generating component 209 is input at the evaporator end 211. This causes the working fluid 207 to vaporise, creating a pressure gradient. The pressure gradient pushes the vapour 208 to flow along the cooling device 201, through a central channel 213 to a condenser end 215. The condenser end 215 is proximate to a heat exchanger 217. At the condenser end 215 the vapour 208 condenses due to this end being cooler, giving up its latent heat of vaporisation. Heat is transferred to the atmosphere 219 via the heat exchanger 217. The working fluid 207 is then returned to the evaporator end 211 by capillary forces developed in the wick structure 205 or by gravity.

According to a further example embodiment of the invention (FIGS. 8 and 9) an equipment enclosure 401 is provided for electromagnetically isolating an electronic device. The enclosure 401 comprises a conductive housing 403 and a plurality of conductive sheets 405. Each conductive sheet 405 includes an aperture 407. The sheets 405 are stacked in a spaced-apart relationship within the housing 403, thereby defining a plurality of electromagnetically isolated cavities 409. Each cavity 409 is electro-magnetically isolated from other cavities 409 and each cavity is within a Faraday cage formed by the conductive housing 403 and the conductive sheets 405.

Figure 8:
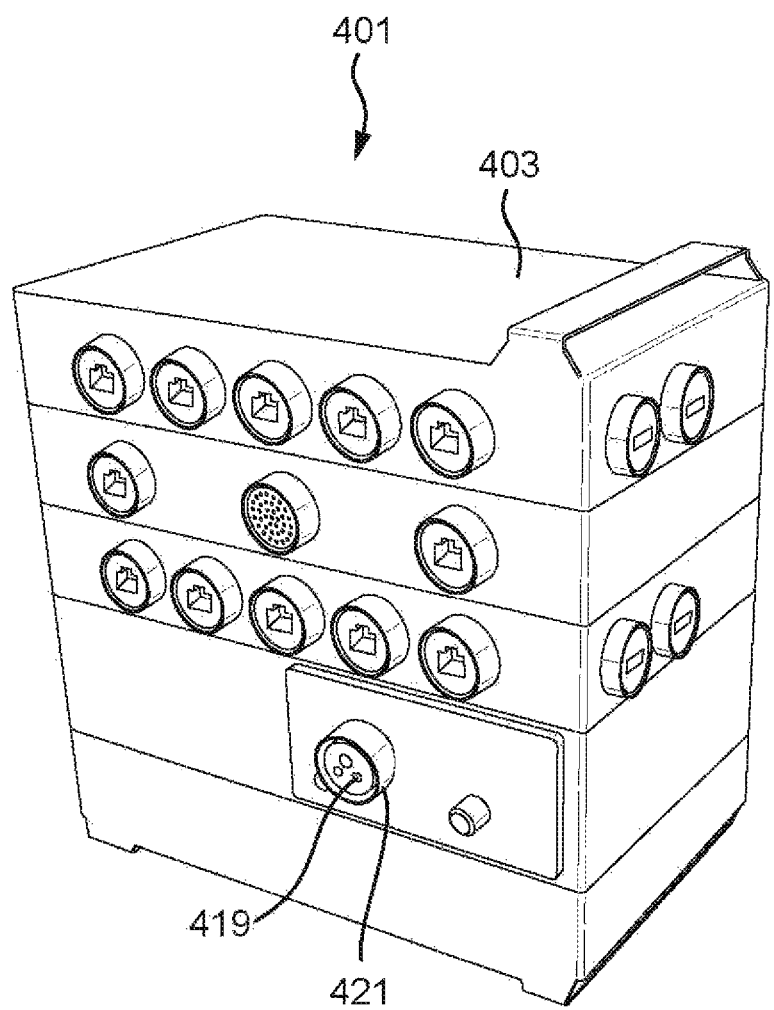
FIG. 8 is a perspective view of an equipment enclosure according to a further example embodiment of the invention.
Figure 9:
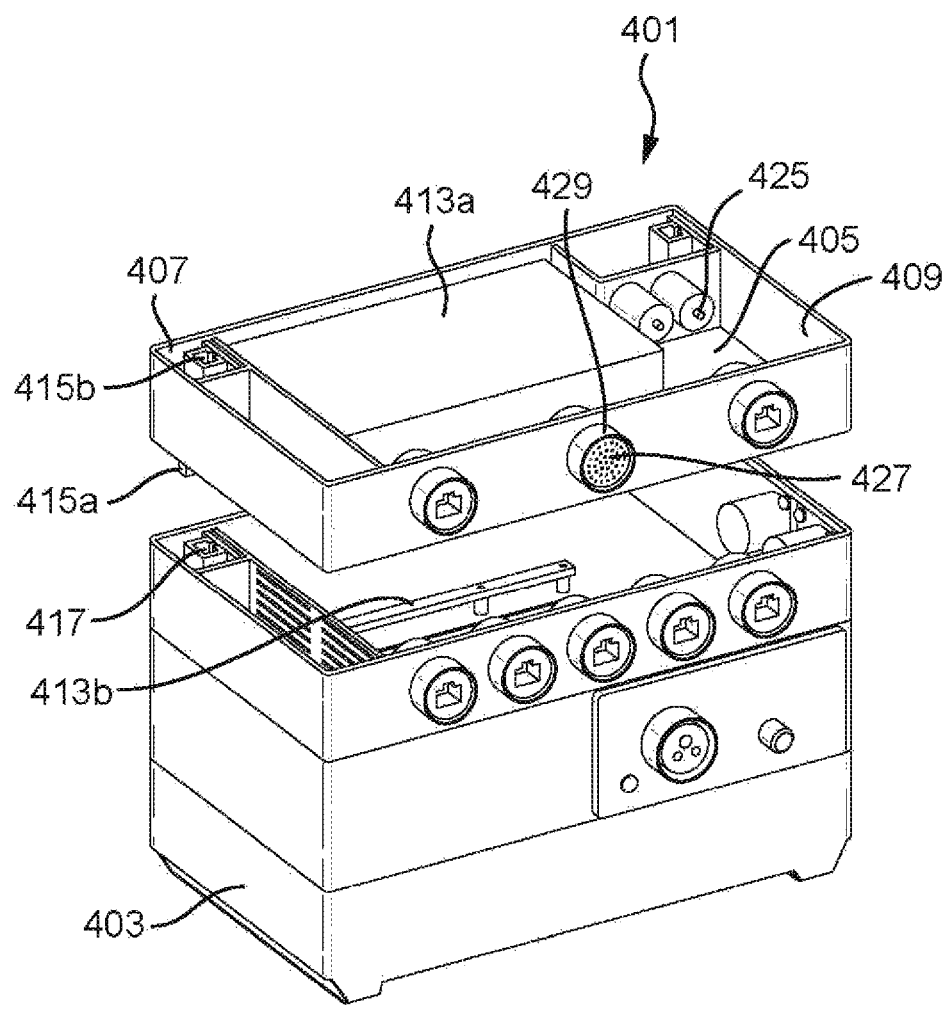
FIG. 9 is an exploded perspective view of a section of the equipment enclosure of FIG. 8.

In the example embodiment shown in FIGS. 8 and 9, the equipment enclosure 401 houses a computing device 413. The computing device 413 comprises a plurality of components 413*a/b*, including a crypto unit 413*a*. The components 413*a/b* are housed in the cavities 409 provided in the enclosure 401.

The enclosure 401 includes internal connectors for providing connections between components 413*a/b* of the computing device 413. The connectors comprise inter-slice plugs 415*a* and sockets 415*b*. The connectors pass through a channel 417 to provide a connection between the components 413*a/b*. Data can be transferred between components via the interslice buses.

The enclosure 401 comprises an external connector 419 for providing power to the electronic device. The external connector 419 is provided in an aperture 421 in the enclosure housing. Internal connectors in the form of power filters 425 are provided to transfer power between components 413*a/b*.

The enclosure 401 comprises a further external connector 427 for providing an external interface for the crypto unit 413*a*. This further external connector 427 is provided in an aperture 429 in the enclosure housing.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

In the example embodiments shown above, the sheets are stacked vertically on top of each other. However, in alternative embodiments, the conductive sheets may be stacked horizontally, or stacked at any other angle.

In the example embodiment shown in FIG. 2 the structure for attenuating radiation is a 3-dimensional honeycomb cellular structure, wherein the cells extend through the channel forming sub-channels. In alternative embodiments the structure may be a cellular structure comprising square, rectangular, circle, or any other shaped cells. In FIG. 2, the sub-channels are shown as extending the entire length of the channel, however, the sub-channels may not extend the entire length of the sub-channel. The depth of the sub-channels will depend on a range of factors including the wavelength of the electromagnetic radiation and the diameter of the cells. The sub-channels formed in FIG. 2 are shown as being straight sub-channels, but the sub-channels may be angled, or may comprise angled-portions that are arranged to form zig-zag sub-channels.

In embodiments of the invention, the cooling mechanism may comprise a higher pressure supply channel and a lower pressure exhaust channel, separated by a heat spreader plate. The higher pressure supply channel may be provided by a series of apertures provided in each sheet of the enclosure.

The lower pressure exhaust channel may be provided by a further series apertures in each sheet of the enclosure. A heat spreader plate provided in a cavity of the enclosure may transfer heat from the higher pressure channel to the low pressure channel to cool the enclosure.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

What is claimed is:

1. An equipment enclosure for electromagnetically isolating an electronic device, the equipment enclosure comprising:
    a conductive housing; and
    a plurality of conductive sheets, each conductive sheet including a first aperture, wherein the conductive sheets are stacked in a spaced-apart relationship within the conductive housing, thereby defining a plurality of electromagnetically-isolated cavities, each within a respective Faraday cage formed by the conductive housing and the plurality of conductive sheets, and wherein the apertures form a channel that extends through the equipment enclosure providing a route for connections between the plurality of electromagnetically-isolated cavities;
    wherein an internal connector passes through the channel in the equipment enclosure and may connect at least two electro-magnetically isolated components; and
    wherein the equipment enclosure includes at least one first internal connector and at least one second internal connector, wherein the at least one first internal connector and the at least one second internal connector provide a first level of shielding and a second level of shielding, and wherein the at least one first internal connector connects components that require the first level of shielding and the at least one second internal connector connects components that require the second level of shielding, wherein the first level of shielding and the second level of shielding are different.

2. The equipment enclosure of claim 1, wherein each conductive sheet of the plurality of conductive sheets includes two or more apertures, and wherein the two or more apertures form two or more of the channels that extend through the equipment enclosure, providing alternative routes for connections between the cavities.

3. The equipment enclosure of claim 1, wherein a structure for attenuating electromagnetic radiation is provided in each of the channels.

4. The equipment enclosure of claim 3, wherein the structure is a 3-dimensional cellular structure comprising a plurality of cells that form sub-channels extending through the channel.

5. The equipment enclosure of claim 4 wherein the structure is a 3-dimensional honeycomb structure.

6. The equipment enclosure of claim 1, wherein the equipment enclosure houses the electronic device comprising the at least two electro-magnetically isolated components, and wherein each component is housed in a different electro-magnetically isolated cavity of the plurality of electromagnetically-isolated cavities.

7. The equipment enclosure of claim 1, further comprising at least one external connector for providing power to the electronic device.

8. The equipment enclosure of claim 7, wherein the at least one external connector connects at least one of the at least two electro-magnetically isolated components of the electronic device to an external power supply, and wherein the at least one external connector is provided in an external connector aperture in the conductive enclosure housing.

9. The equipment enclosure of claim 1, wherein the electronic device comprises a computing device, wherein the computing device includes at least one of a crypto unit, a processor, a power supply unit, a high performance EMI filter and circulator.

10. The equipment enclosure of claim 1, further comprising a cooling mechanism.

11. The equipment enclosure of claim 1, wherein each conductive sheet includes a second aperture, and wherein these second apertures form a second, cooling, channel that extends through the conductive housing.

12. The equipment enclosure of claim 11, wherein a cooling device is provided in the cooling channel.

13. The equipment enclosure of claim 12, wherein the cooling device comprises:
    a pressure vessel, wherein the pressure vessel comprises an evaporator proximate to the at least two electro-magnetically isolated components;
    a condenser end; and
    a working fluid provided within the pressure vessel,
    wherein the working fluid absorbs heat at the evaporator, thereby generating a pressure gradient within the pressure vessel, and
    wherein the pressure gradient causes the working fluid to flow away from an evaporator end towards the condenser end, thereby transferring heat away from the component.

14. The equipment enclosure of claim 2, wherein a structure for attenuating electromagnetic radiation is provided in the channel.

15. The equipment enclosure of claim 14, wherein the structure is a 3-dimensional cellular structure comprising a plurality of cells that form sub-channels extending through the channel.

16. The equipment enclosure of claim 15, wherein the structure is a 3-dimensional honeycomb structure.

* * * * *